(12) United States Patent
Buchtmann et al.

(10) Patent No.: US 8,245,407 B2
(45) Date of Patent: *Aug. 21, 2012

(54) COATING FOR CUTTING IMPLEMENTS

(75) Inventors: Larry Buchtmann, Goldsboro, NC (US); Gary Pia, Stratford, CT (US)

(73) Assignee: Acme United Corporation, Fairfield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/337,976

(22) Filed: Jan. 23, 2006

(65) Prior Publication Data

US 2006/0201003 A1    Sep. 14, 2006

Related U.S. Application Data

(63) Continuation of application No. 10/720,578, filed on Nov. 24, 2003, now Pat. No. 6,988,318, which is a continuation of application No. PCT/US02/36314, filed on Nov. 13, 2002.

(60) Provisional application No. 60/338,575, filed on Nov. 13, 2001.

(51) Int. Cl.
*B26B 9/00* (2006.01)

(52) U.S. Cl. .............................. 30/350; 30/346; 428/457

(58) Field of Classification Search .................... 30/346, 30/350; 76/104.1; 428/457
See application file for complete search history.

(56) References Cited

U.S. PATENT DOCUMENTS

| | | | |
|---|---|---|---|
| 437,468 A | 9/1890 | Wheeler |
| 1,740,395 A | 12/1929 | Durst |
| 1,941,215 A | 12/1933 | Liggo |
| 2,103,217 A | 12/1937 | Ford |
| 2,214,890 A | 9/1940 | Rhodes, Jr. |
| 2,270,473 A | 1/1942 | Porcelli |
| 2,408,767 A | 10/1946 | Fleming |
| 2,561,438 A | 7/1951 | Duchesneau |
| 2,822,781 A | 2/1958 | Burton |
| 3,004,522 A | 10/1961 | Kent |
| 3,106,910 A | 10/1963 | Lou |
| 3,175,539 A | 3/1965 | Saflund et al. |
| 3,467,843 A | 9/1969 | Dailey |
| 3,490,324 A | 1/1970 | Dahle |
| 3,595,285 A | 7/1971 | Ruben |

(Continued)

FOREIGN PATENT DOCUMENTS

DE      34 47 962      11/1985

(Continued)

OTHER PUBLICATIONS

Non-Final Office Action mailed Nov. 16, 2009 for U.S. Appl. No. 11/557,806, filed Nov. 8, 2006.

(Continued)

*Primary Examiner* — Hwei C Payer

(74) *Attorney, Agent, or Firm* — Alix, Yale & Ristas, LLP

(57) ABSTRACT

A cutting implement having a pair of cutting blades and a coating is provided. The coating has titanium chromium nitride and provides the cutting blades with a satin silver appearance. In some embodiments, the titanium chromium nitride coating has a thickness in a range between about 0.3 microns and 0.5 microns, a surface roughness in a range of about 15 to 25 $10^{-6}$ inch/inch, and a hardness in a range of about 5.7 to about 9.1 gigapascals.

8 Claims, 7 Drawing Sheets

| Sample No. | Target Composition | Average Hardness (Gegapascals) | Hardness Range (Gegapascals) | Appearance |
|---|---|---|---|---|
| 1 | None | 5.9 | 5.4 - 6.3 | Medium gloss silver |
| 2 | 100% Ti | 7.0 | 5.8 - 7.2 | Satin gold |
| 3 | 75% Ti / 25% Cr | 7.3 | 5.8 - 8.8 | Satin gold |
| 4 | 50% Ti / 50% Cr | 7.4 | 7.2 - 7.6 | Satin silver |
| 5 | 25% Ti / 75% Cr | 7.4 | 5.7 - 9.1 | Satin silver |
| 6 | 100% Cr | 7.9 | 6.5 - 9.3 | Medium gloss silver |
| 7 | 90% Ti / 10% Cr | 6.5 | 6.1 - 6.9 | Satin gold |
| 8 | 60% Ti / 40% CR | 7.1 | 6.8 - 7.4 | Satin gold |
| 9 | 25% Ti / 75% Cr | 7.4 | 6.9 - 7.9 | Satin silver |
| 10 | 10% Ti / 90% Cr | 9.0 | 8.9 - 9.1 | Medium gloss silver |

* Shank formed of heat-treated 420 stainless steel in all samples.

U.S. PATENT DOCUMENTS

| | | | |
|---|---|---|---|
| 3,596,355 A * | 8/1971 | Wertepny, Sr. | 30/252 |
| 3,678,975 A | 7/1972 | Imanishi et al. | |
| 3,776,286 A | 12/1973 | Blanck | |
| 3,777,791 A | 12/1973 | Uchida | |
| 3,792,636 A | 2/1974 | Pottern | |
| 3,874,900 A | 4/1975 | Post et al. | |
| 3,889,730 A | 6/1975 | Buc | |
| 3,937,239 A | 2/1976 | Bosland | |
| 3,988,955 A | 11/1976 | Engel et al. | |
| 4,007,524 A | 2/1977 | Hannes et al. | |
| 4,046,044 A | 9/1977 | Paterson et al. | |
| 4,050,487 A | 9/1977 | Mabuchi et al. | |
| 4,431,038 A | 2/1984 | Rome | |
| 4,436,830 A | 3/1984 | Andreev et al. | |
| 4,450,205 A | 5/1984 | Itaba et al. | |
| 4,469,489 A | 9/1984 | Sarin | |
| 4,470,895 A | 9/1984 | Coad et al. | |
| 4,601,316 A | 7/1986 | Verdi | |
| 4,670,172 A | 6/1987 | Sproul et al. | |
| 4,685,366 A | 8/1987 | Beder | |
| 4,698,266 A | 10/1987 | Buljan | |
| 4,755,237 A | 7/1988 | Lemelson | |
| 4,815,507 A | 3/1989 | O'Rourke | |
| D305,248 S | 12/1989 | Ukisu | |
| 4,892,792 A | 1/1990 | Sarin | |
| D306,551 S | 3/1990 | Yuen | |
| 4,933,058 A | 6/1990 | Bache et al. | |
| D311,027 S | 10/1990 | Yuen | |
| 4,966,208 A | 10/1990 | Uang | |
| 4,981,756 A | 1/1991 | Rhandhawa | |
| 4,984,492 A | 1/1991 | Gerber | |
| 5,027,684 A | 7/1991 | Neukam | |
| D320,812 S | 10/1991 | Yuen | |
| 5,052,453 A | 10/1991 | Chen | |
| D324,184 S | 2/1992 | Benech | |
| D324,700 S | 3/1992 | Shimoo et al. | |
| 5,120,596 A | 6/1992 | Yamada | |
| 5,152,774 A | 10/1992 | Schroeder | |
| 5,162,147 A | 11/1992 | Ruppi | |
| D333,839 S | 3/1993 | Kiyokane | |
| D335,308 S | 5/1993 | Shapiro et al. | |
| D336,124 S | 6/1993 | Ordlock | |
| 5,219,354 A | 6/1993 | Choudhury et al. | |
| D339,536 S | 9/1993 | Ribron | |
| 5,301,431 A | 4/1994 | Cera | |
| 5,322,001 A | 6/1994 | Boda | |
| D354,987 S | 1/1995 | Yuen | |
| 5,379,817 A | 1/1995 | O'Neil et al. | |
| 5,476,134 A | 12/1995 | Whittle et al. | |
| 5,477,616 A | 12/1995 | Williams et al. | |
| D367,618 S | 3/1996 | Stewart et al. | |
| 5,525,420 A | 6/1996 | Kaufmann | |
| 5,528,833 A | 6/1996 | Sakuma | |
| 5,584,845 A | 12/1996 | Hart | |
| D377,666 S | 1/1997 | Yuen | |
| D378,834 S | 4/1997 | Yuen | |
| D378,835 S | 4/1997 | Guerrero | |
| D383,165 S | 9/1997 | Gstalder | |
| D383,783 S | 9/1997 | Jeter et al. | |
| 5,671,647 A | 9/1997 | Mori | |
| D387,091 S | 12/1997 | Anderson | |
| 5,700,094 A | 12/1997 | Dam | |
| D388,828 S | 1/1998 | Robinson et al. | |
| D390,264 S | 2/1998 | Singleton et al. | |
| 5,724,868 A | 3/1998 | Knudsen et al. | |
| 5,746,586 A | 5/1998 | Fukuhara | |
| D396,062 S | 7/1998 | White et al. | |
| D396,886 S | 8/1998 | de Melo et al. | |
| D397,048 S | 8/1998 | Herndon | |
| D402,314 S | 12/1998 | Lidle, Jr. et al. | |
| D405,830 S | 2/1999 | Mak | |
| D406,173 S | 2/1999 | Chen | |
| 5,894,666 A | 4/1999 | Hrusch | |
| D409,102 S | 5/1999 | Balliette | |
| 5,898,998 A * | 5/1999 | Deville | 30/193 |
| D412,344 S | 7/1999 | Clark | |
| D417,238 S | 11/1999 | Huang | |
| 5,983,507 A | 11/1999 | Hirai | |
| D417,693 S | 12/1999 | Daley, Jr. | |
| 5,996,459 A | 12/1999 | Cornell et al. | |
| D418,874 S | 1/2000 | Shapiro | |
| D420,390 S | 2/2000 | Donaldson | |
| D422,313 S | 4/2000 | Chen | |
| D423,585 S | 4/2000 | Chen | |
| D425,560 S | 5/2000 | Yuen | |
| 6,065,514 A | 5/2000 | New | |
| D426,852 S | 6/2000 | Gstalder | |
| 6,076,264 A | 6/2000 | Meckel | |
| 6,098,515 A | 8/2000 | Daley, Jr. | |
| D431,263 S | 9/2000 | Greenhouse | |
| 6,189,218 B1 | 2/2001 | Okada | |
| D441,796 S | 5/2001 | Chan | |
| D442,993 S | 5/2001 | Eisen | |
| 6,249,981 B1 | 6/2001 | Shu | |
| D445,833 S | 7/2001 | Fonfeder | |
| D449,072 S | 10/2001 | Bennett | |
| 6,309,738 B1 | 10/2001 | Sakurai | |
| D451,961 S | 12/2001 | Shapiro | |
| 6,330,750 B1 | 12/2001 | Meckel | |
| D453,188 S | 1/2002 | Fonfeder | |
| D454,159 S | 3/2002 | Tsuchikura | |
| 6,372,369 B1 | 4/2002 | Ito et al. | |
| 6,391,457 B1 | 5/2002 | Welty | |
| D460,115 S | 7/2002 | Sawyer | |
| D460,116 S | 7/2002 | Gstalder | |
| 6,422,110 B1 | 7/2002 | Wurst et al. | |
| D461,206 S | 8/2002 | Gstalder | |
| 6,460,443 B1 | 10/2002 | Hsiao | |
| 6,467,527 B1 * | 10/2002 | Kubota et al. | 164/113 |
| 6,470,929 B2 | 10/2002 | Fregeolle | |
| D466,940 S | 12/2002 | Gstalder | |
| 6,492,011 B1 | 12/2002 | Brandle et al. | |
| 6,497,772 B1 * | 12/2002 | Meckel et al. | 148/254 |
| D469,809 S | 2/2003 | Gstalder | |
| D470,182 S | 2/2003 | Gstalder | |
| D470,183 S | 2/2003 | Gstalder | |
| D470,889 S | 2/2003 | Daley, Jr. | |
| 6,540,451 B1 | 4/2003 | Mori | |
| D474,508 S | 5/2003 | Lammers et al. | |
| 6,558,822 B2 * | 5/2003 | Nagasaka et al. | 428/700 |
| 6,559,882 B1 | 5/2003 | Kerchner | |
| 6,565,957 B2 | 5/2003 | Nakamura | |
| D477,017 S | 7/2003 | Vossler et al. | |
| D477,847 S | 7/2003 | Gosse | |
| D480,110 S | 9/2003 | Lin | |
| 6,617,057 B2 | 9/2003 | Gorokhovsky et al. | |
| 6,637,481 B2 | 10/2003 | Mak et al. | |
| 6,675,689 B2 | 1/2004 | Nunez et al. | |
| D489,094 S | 4/2004 | Bodum | |
| 6,730,392 B2 | 5/2004 | Vetter et al. | |
| D494,222 S | 8/2004 | Berry | |
| 6,845,795 B2 | 1/2005 | Lammers et al. | |
| 6,866,921 B2 | 3/2005 | Grab et al. | |
| 6,886,614 B2 | 5/2005 | Ricono et al. | |
| 6,929,851 B1 | 8/2005 | Leverenz et al. | |
| 6,988,318 B2 | 1/2006 | Buchtmann et al. | |
| 7,008,688 B2 | 3/2006 | Toihara | |
| 7,037,587 B2 * | 5/2006 | Lin | 428/426 |
| 7,140,113 B2 | 11/2006 | King et al. | |
| 2002/0096031 A1 | 7/2002 | Yang | |
| 2003/0070305 A1 | 4/2003 | Oshika et al. | |
| 2003/0140757 A1 | 7/2003 | Carlson et al. | |
| 2003/0140761 A1 | 7/2003 | Schulz | |
| 2003/0154835 A1 | 8/2003 | Nunez et al. | |
| 2004/0142205 A1 | 7/2004 | Chen | |
| 2004/0168324 A1 | 9/2004 | Buchtmann et al. | |
| 2004/0234704 A1 | 11/2004 | Garg | |
| 2004/0244539 A1 * | 12/2004 | Korb et al. | 76/104.1 |
| 2005/0245403 A1 * | 11/2005 | Harris et al. | 508/322 |
| 2005/0255329 A1 | 11/2005 | Hazel et al. | |
| 2006/0095060 A1 | 5/2006 | Mayenberger et al. | |

FOREIGN PATENT DOCUMENTS

| | | |
|---|---|---|
| EP | 0095128 A1 | 11/1983 |
| EP | 0095130 A1 | 11/1983 |
| EP | 0095131 A1 | 11/1983 |
| EP | 801144 A1 | 10/1997 |

| | | |
|---|---|---|
| EP | 0846538 A2 | 6/1998 |
| EP | 1 087 031 A2 * | 3/2001 |
| JP | 62-181836 | 8/1987 |
| JP | 1047849 | 2/1989 |
| JP | 2080901 | 3/1990 |
| JP | 4-114689 | 4/1992 |
| JP | 5-68754 | 3/1993 |
| JP | 5-84363 | 4/1993 |
| JP | 5-146558 | 6/1993 |
| JP | 7268660 | 10/1995 |
| JP | 10168583 | 6/1998 |
| JP | 2925430 | 7/1999 |
| JP | 3373590 | 2/2003 |
| JP | 2005097651 | 4/2005 |
| WO | 9418354 A1 | 8/1994 |
| WO | 03041919 | 5/2003 |
| WO | 2005061410 A1 | 7/2005 |
| WO | 2007035807 A2 | 3/2007 |

OTHER PUBLICATIONS

Modern Machine Shop, Multiple Layer Coatings Keep Microcracks from Destroying Inserts, posted on Jan. 15, 1999, http://www.mmsonline.com/articles/multiple-layer-coatings-keep-microcracks-from-destr...; printed Nov. 21, 2008.

Madorsky et al., Coating for stamping and forming tools, Mar. 8, 2005, http://www.thefabricator.com/Printer_Friendly_Article.cfm?ID=1058, printed Nov. 21, 2008.

Tooling & Production, Coating Technology Takes Another Quantum Leap, http://www.manufacturingcenter.com/tooling/archives/0399/399quan.asp, printed Aug. 7, 2006.

Surviliene, et al., Surface & Coatings Technology, 176, 2004, pp. 193-201.

Zimmermann, Oberflachen—Polysurfaces No. 4, vol. 41, 2000, pp. 14-19.

Veprek, et al., Surface Engineering: Science and Technology I, The Minerals, Metals and Materials Society, 1999, pp. 219-231.

Chen, et al., Surface Engineering: Science and Technology I, The Minerals, Metals and Materials Society, 1999, pp. 379-384.

Lugscheider, et al., Surface Engineering: Science and Technology I, The Minerals, Metals and Materials Society, 1999, pp. 405-414.

Holleck, Surface Engineering: Science and Technology I, The Minerals, Metals and Materials Society, 1999, pp. 207-218.

Zhang, et al., Surface and Coatings Technology, 167, 2003, pp. 113-119.

Nonfinal Office Action mailed May 1, 2008 for U.S. Appl. No. 11/337,789, filed Jan. 23, 2006.

Final Office Action mailed May 21, 2009 for U.S. Appl. No. 11/337,789, filed Jan. 23, 2006.

Nonfinal Office Action mailed Oct. 16, 2007 for U.S. Appl. No. 11/231,151, filed Sep. 20, 2005.

Final Office Action mailed Aug. 26, 2008 for U.S. Appl. No. 11/231,151, filed Sep. 20, 2005.

Nonfinal Office Action mailed Dec. 29, 2008 for U.S. Appl. No. 11/557,806, filed Nov. 8, 2006.

Nonfinal Office Action mailed Jul. 3, 2008 for U.S. Appl. No. 11/231,259, filed Sep. 20, 2005.

Final Office Action mailed Mar. 11, 2009 for U.S. Appl. No. 11/231,259, filed Sep. 20, 2005.

* cited by examiner

| Sample No. | Target Composition | Average Hardness (Gegapascals) | Hardness Range (Gegapascals) | Appearance |
|---|---|---|---|---|
| 1 | None | 5.9 | 5.4 - 6.3 | Medium gloss silver |
| 2 | 100% Ti | 7.0 | 5.8 - 7.2 | Satin gold |
| 3 | 75% Ti / 25% Cr | 7.3 | 5.8 - 8.8 | Satin gold |
| 4 | 50% Ti / 50% Cr | 7.4 | 7.2 - 7.6 | Satin silver |
| 5 | 25% Ti / 75% Cr | 7.4 | 5.7 - 9.1 | Satin silver |
| 6 | 100% Cr | 7.9 | 6.5 - 9.3 | Medium gloss silver |
| 7 | 90% Ti / 10% Cr | 6.5 | 6.1 - 6.9 | Satin gold |
| 8 | 60% Ti / 40% CR | 7.1 | 6.8 - 7.4 | Satin gold |
| 9 | 25% Ti / 75% Cr | 7.4 | 6.9 - 7.9 | Satin silver |
| 10 | 10% Ti / 90% Cr | 9.0 | 8.9 - 9.1 | Medium gloss silver |

* Shank formed of heat-treated 420 stainless steel in all samples.

Fig. 5

COATING FOR CUTTING IMPLEMENTS

CROSS REFERENCE TO RELATED APPLICATIONS

This application is a continuation of U.S. application Ser. No. 10/720,578 filed Nov. 24, 2003, now U.S. Pat. No. 6,988,318, incorporated herein by reference. U.S. application Ser. No. 10/720,578 is a continuation of International Application No. PCT/US02/36314 filed Nov. 13, 2002, which claims priority from Provisional Application No. 60/338,575, filed Nov. 13, 2001.

BACKGROUND OF THE INVENTION

1. Field of the Invention

The present invention is related to stationery cutting implements such as scissors, shears, guillotine style paper trimmers, and rotary style paper trimmers. More particularly, the present invention is related to a coating for such cutting implements.

2. Description of Related Art

Substantial effort has been expended in improving the construction and operation of stationery cutting implements for household and office use. Ever increasing demands have been placed on manufacturers of these products to increase the ease of use, the wear resistance, and the ease with which the products can be cleaned, while maintaining a competitive price. For example, typical household and office scissors have been unable to achieve a long-lasting cutting edge, which withstands the wide-variety of products being cut, at a competitive price.

Consequently, continued improvements in stationery cutting implements is desired.

BRIEF SUMMARY OF THE INVENTION

It is an object of the present invention to provide a cutting implement having a coating that provides one or more of improved wear resistance, increased hardness, pleasing appearance, reduced user effort, and increased stain resistance.

It is a further object of the present invention to provide a cutting implement having a coating that provides one or more of improved wear resistance, increased hardness, pleasing appearance, reduced user effort, and increased stain resistance.

These and other objects of the present invention are provided by a cutting implement comprising a pair of cutting blades and a coating. The coating comprises titanium chromium nitride, which provides the cutting blades with a satin silver appearance.

A cutting implement having a pair of complementary cutting blades and a titanium chromium nitride coating is also provided. The titanium chromium nitride coating is disposed on each of the cutting blades. The titanium chromium nitride coating has a thickness in a range between about 0.3 and 0.5 microns, a surface roughness in a range of about 15 to $25 \times 10^{-6}$ inch/inch, and a hardness in a range of about 5.7 to about 9.1 gigapascals.

One embodiment described herein is a cutting implement comprising a cutting blade, and a coating disposed on the cutting blade, wherein the coating includes titanium nitride, chromium nitride and titanium chromium nitride with a titanium to chromium weight ratio in the range of 1:3 to 3:2, wherein the coating has a thickness less than 5.0 microns, and further wherein the titanium nitride, chromium nitride and titanium chromium nitride are not isolated in different regions of the coating. In some cases, the titanium to chromium weight ratio is in the range of 1:3 to 1:1. Sometimes the titanium to chromium weight ratio is in the range of 1:3 to 1:2. In certain cases, the titanium to chromium weight ratio is in the range of 1:2 to 1:1.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIG. 5 is a data table of testing results of various exemplary embodiments of a coating of the present invention for the scissors of FIG. 1;

DETAILED DESCRIPTION OF THE INVENTION

Figure 1:
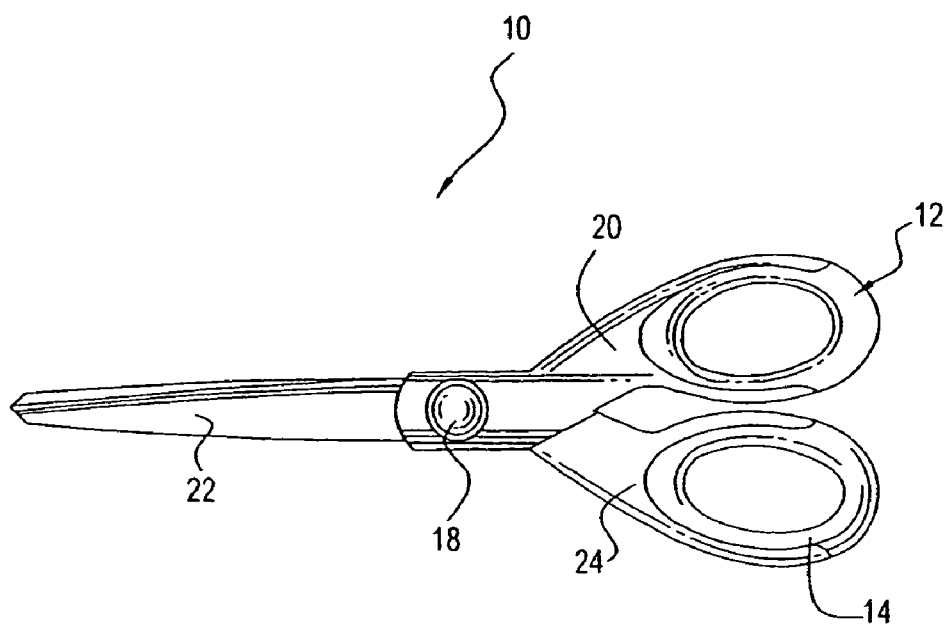
FIG. 1 is a first side view of an exemplary embodiment of a pair of scissors.
Figure 2:
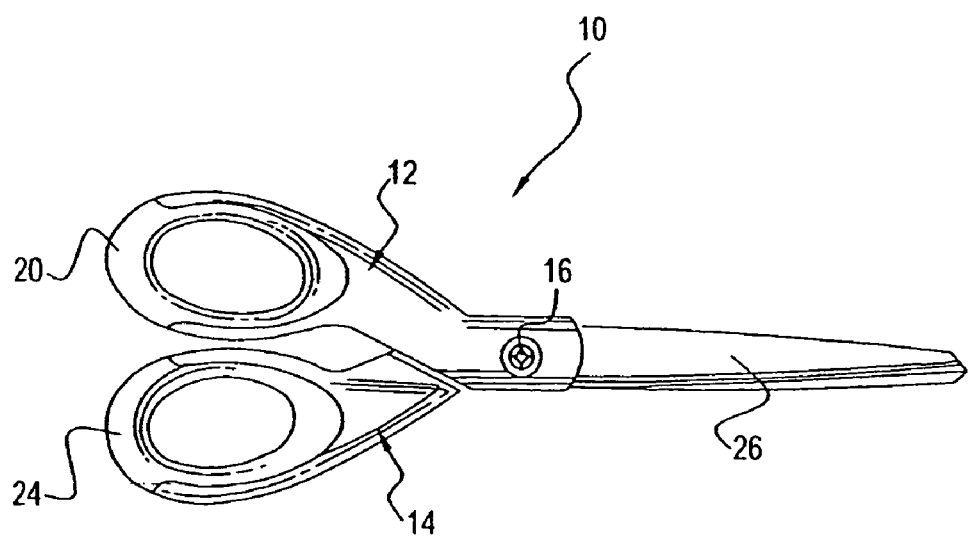
FIG. 2 is a second, opposite side view of FIG. 1.

Referring now to the figures and in particular to FIGS. 1 and 2, a cutting implement in the form of pair of scissors generally indicated by reference numeral 10 is illustrated.

Scissors 10 have a first half 12 pivotally connected to a second half 14. First and second halves 12, 14 are pivotally connected by conventional connection means, such as a screw 16 and a post 18. First half 12 can have a handle 20 and a blade 22. Similarly, second half 14 can have a handle 24 and a blade 26.

Each blade 22, 26 has a cutting edge 28. Preferably, cutting edge 28 is formed by way of a bevel 30 disposed on each blade 22, 26, respectively. Thus, scissors 10 provide a pair of complementary cutting blades 22, 26 for cutting stationery products, such as paper, cardboard, Bristol board, and others.

Handles 20, 24 are preferably overmolded onto blades 22, 26, respectively. However, it should be recognized that each half 12, 14 of scissors 10 is described as having separate handles 20, 24 overmolded onto blades 22, 26, respectively. Of course, it is contemplated by the present invention that each half 12, 14 have a unitary handle and blade portion.

Figure 3:
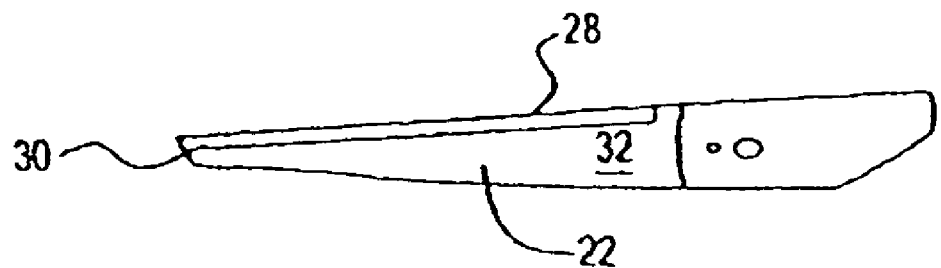
FIGS. 3 and 4 are side views of the blades of FIG. 1.
Figure 4:
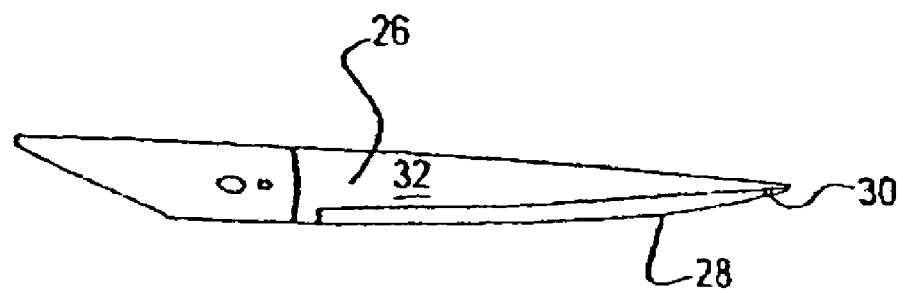

Blade 22 is illustrated in FIG. 3, while blade 26 is illustrated in FIG. 4. Blades 22, 26 are preferably made of steel, more preferably stainless steel, such as 420 stainless steel. In addition, blades 22, 26 can be heat-treated to further increase the hardness of the blades.

Scissors 10 further include a coating 32 disposed on each blade 22, 26. Coating 32 provides cutting edges 28 with extremely tough, hard, wear resistant characteristics. The increased hardness of cutting edges 28 provides scissors 10 with substantially increased longevity, while also providing the scissors with corrosion resistance, as well as providing a smooth and uniform appearance and color. For example, scissors 10 having coating 32 were subjected to cycle testing of 10,000 openings and closings without showing any signs of wear to the coating.

In addition, coating 32 provides scissors 10 with an aesthetically acceptable color or appearance. Specifically, coating 32 differentiates blades 22, 26 having coating 32 from uncoated blades. Coating 32 does not change the color of blades 22, 26 to the point that the consumer no longer recognizes scissors 10 as being useable for general household and office use. However, coating 32 has an appearance sufficient to allow the consumer to recognize that the coating is present on scissors 10.

Further, coating 32 increases the ease of use of scissors 10 by providing blades 22, 26 with a smooth surface finish, which reduces friction between the blades during use. Thus, blades 22, 26 have less friction between the two inside blade faces, which provides a smoother cutting action and less cutting effort than in blades without coating 32.

Coating 32 is selected from the group consisting of titanium nitride (TiN), chromium nitride (CrN), and titanium chromium nitride (TiCrN). More preferably, coating 32 is a multiple component barrier of titanium chromium nitride.

Coating 32 is disposed on blades 22, 26 such that the coating forms a metallurgical bond with the blades, which resists flaking, blistering, chipping, and peeling. In fact, coating 32 is absorbed into the surface layer of the metal of blades 22, 26. Coating 32 is disposed on blades 22, 26 with a thickness in a range between about 0.3 and 0.5 microns, more preferably about 0.4 microns.

FIG. 5 illustrates the test results for a range of compositions and processes for coating 32. Sample 1 is a control or uncoated blade formed of heat-treated 420 stainless steel. Heat-treated 420 stainless steel blades were also used in Samples 2 through 10.

In Samples 2 through 6, the blades were coated using a first process. Twelve (12) blades of each sample coating were prepared with a thickness of about 5.0 micrometers. In Samples 7 through 10, the blades were coated using a second process. All of the samples were then tested for surface smoothness, hardness, and color. The results of this testing are provided in FIG. 5.

The concentration of coating 32 in all samples were tested and were in the range of about +/−3 to 4 percent of the target composition. The testing also showed that both the elements are uniformly deposited and there is no segregation or isolation of each to any particular region in the film.

The first process was a reactive magnetron sputtering with a pulsed dc source. The second process comprised a cathode arc plasma (CAP) process. The sputtering gas mixture in each process was argon and nitrogen.

In the first process, a four-inch circular target is used with a pulsed dc power supply. The target was a combination target having one or more 90-degree sections of pure titanium and chromium. For example, in Sample #3 the target is three 90-degree sections of pure titanium and one 90-degree section of pure chromium.

In the second process, two different targets were used simultaneously, with each target being pure titanium and chromium.

The partial pressure of argon during the first process was maintained between 0 to 1 millitorr and that of nitrogen was maintained at 1 to 2 millitorr with the total sputtering gas pressure maintained between 2 to 3 millitorr. The stainless steel chamber was evacuated to $2\times10^{-5}$ Torr prior to the deposition. Cleaning of the target was carried with argon alone. The sputtering current was kept at 0.3 amps during cleaning that was carried out for 3 minutes in all depositions. Deposition of the films on the blades during cleaning was prevented by a shutter that was withdrawn soon after cleaning the target. The sputtering current was chosen at two different values, 0.5 amperes and 0.7 amperes. Depositions were performed for two different total sputtering times, 15 minutes and 30 minutes. The resulting thickness of the films was found to be 0.3 micrometers and 0.6 micrometers, respectively. The deposition temperature has been optimized for the following conditions. Stainless steel scissors blades should not soften and therefore deposition temperature was kept at a temperature of about 150° and 200° C.

The hardness of the samples was measured using a Vickers microhardness test according to American Society of Testing and Materials (ASTM) E384, last revised March 2001. Here, a diamond indenter is loaded to a desired amount, which causes the indenter to indent the sample. The indentation is measured and converted to a hardness value. The indenter is a three-sided, pyramid shaped diamond probe tip with angle of 136°. The hardness values of FIG. 5 represent the hardness of each sample with load of about 50 grams, with a load of about 400 grams for the uncoated sample 1.

The results of FIG. 5 show that the coated samples (samples 2 to 10) are generally harder than the uncoated sample (sample 1). For example, sample 4 is about 125% harder than sample 1. Further, the results of FIG. 5 show that the hardness of the coated samples (samples 2 to 10) generally tends to increase as the content of chromium increases.

In addition, the results of FIG. 5 show that the silver appearance generally tends to increase as the content of chromium increases.

The samples having a majority of chromium (e.g., samples 6 and 10) had a gloss silver appearance, which was substantially similar to that of uncoated samples 1. In fact, it has been determined that consumers did not recognize that the scissors having a gloss silver appearance (e.g., the samples having a majority of chromium) had any coating at all.

In contrast, the samples having a majority of titanium (e.g., samples 2, 3, 7 and 8) had a satin gold appearance. Here, it has been determined that consumers recognized scissors having a satin gold appearance (e.g., the samples having a majority of titanium) as being for uses other than general household and office use. Namely, these scissors appear to the consumer to be specialty scissors.

However, the samples having a more balanced amount of titanium to chromium (e.g., samples 4, 5, and 9) had a satin silver appearance. Here, it has been determined that consumers recognized scissors 10 having a satin silver appearance as being for general household use and as having a coating.

Chromium is typically about 2.5 times more expensive than titanium. Thus, forming coating 32 of a majority of chromium leads to a substantial increase in cost, with only minimal gains in hardness. For example, coating 32 having 75% chromium and 25% titanium is about 95% as hard as a coating of 100% chromium.

It has also been found that the chromium nitride forms a strong bond to the blade, but does not form a strong bond with itself. For example, chromium nitride can form a strong bond with the chromium oxide of blade 22, 26, but does not form a strong bond with other chromium nitride molecules. Thus, the samples having a majority of chromium exhibited a higher tendency to peep than other samples having a minority of chromium.

The diffusion barriers properties exhibited by the samples having a majority of titanium were superior to those having less titanium. Thus, the samples having a majority of titanium exhibited better stain and corrosion resistance than other samples having a minority of titanium.

Coating 32 having the desired hardness, smoothness, and diffusion barrier properties preferably is formed of titanium chromium nitride having about 35 percent by weight of titanium nitride and about 65 percent by weight of chromium nitride and with a hardness in a range of about 5.7 to about 9.1 gigapascals. More preferably, coating 32 has about 50 percent by weight of titanium nitride and about 50 percent by weight of chromium nitride and a hardness in a range of about 7.2 to about 7.6 gigapascals.

It has been determined that coating 32 having the aforementioned ratios of chromium nitride and titanium nitride provided scissors 10 with a visual indication that the coating had been applied, without affecting the consumer's impression of the target use of the scissors (i.e., general household use). Moreover, coating 32 having the aforementioned ratios of chromium nitride and titanium nitride provided scissors 10 with drastically improved hardness over the uncoated sample 1.

The surface roughness of blades 22, 26 before and after the application of coating 32 was also measured. For example, the surface roughness of the outside surface of blades 22, 26 before coating 32 was in a range of about 20 to $25 \times 10^{-6}$ inch/inch after the coating was applied. It is believed that the roughness of blades 22, 26 was reduced because the molecules of coating 32 predominantly bond with the valleys and indentations in the blades.

Of course, it should be recognized that scissors 10 are described above by way of example only as having a coating applied by reactive magnetron sputtering and CAP processed. Any thin film forming method such as chemical vapor deposition, physical vapor deposition, thermal spraying and sintering after a dip coating may be employed for providing coating 32 to scissors 10. Preferably, the method of forming coating 32 has a maximum temperature sufficient to not soften or affect the heat-treatment of the uncoated blades.

It should also be recognized that coating 32 has been described above by way of example only as finding use with a cutting implement in the form of scissors 10. Of course, coating 32 can provide the aforementioned benefits to other stationary cutting implement. For example, FIGS. 6 to 9 illustrate alternate exemplary embodiments of cutting implements, which have a coating.

Figure 6:
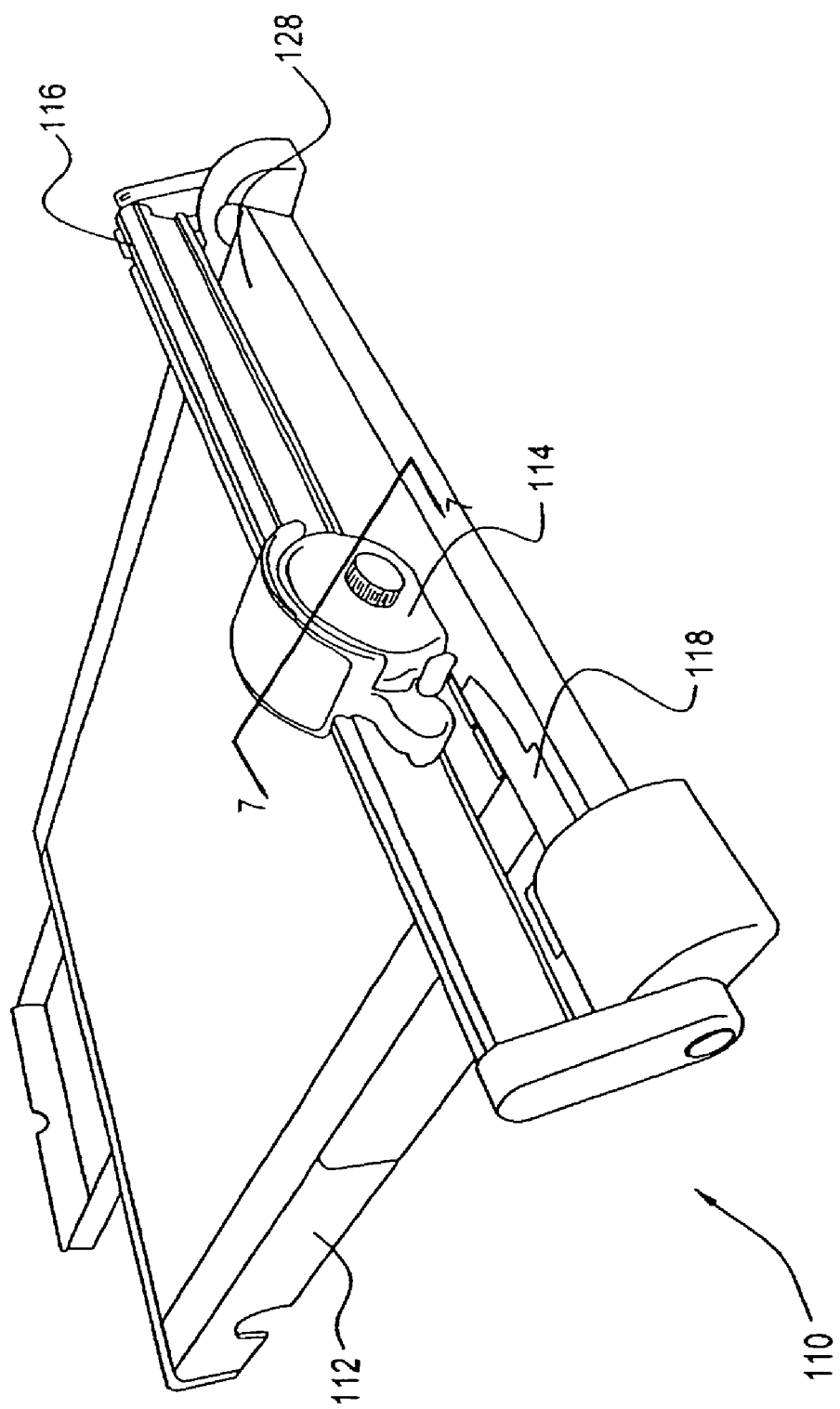
FIG. 6 is a perspective view of an exemplary embodiment of a rotary style paper trimmer.
Figure 7:
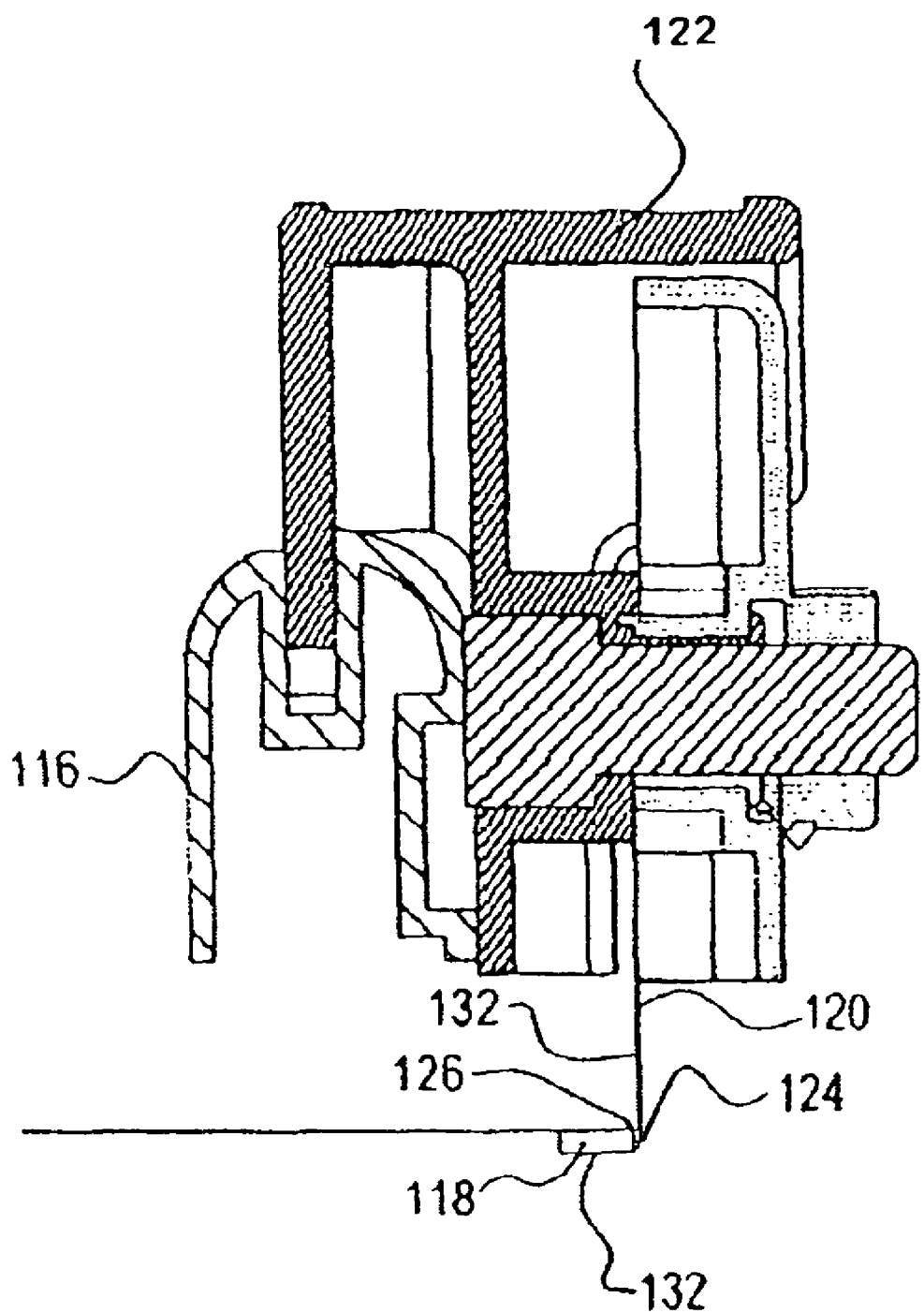
FIG. 7 is a sectional view along line 7-7 of FIG. 6.

An exemplary embodiment of a cutting implement in the form of a rotary style paper trimmer 110 is illustrated in FIGS. 6 and 7. Rotary style paper trimmer 110 is as shown and described in U.S. Provisional Application Ser. No. 60/421,581 filed on Oct. 28, 2002, the contents of which are incorporated herein by reference.

Trimmer 110 has a base 112 and a rotary cutting mechanism 114. Base 112 has a rail 116 and a cutting blade or anvil 118. Rotary cutting mechanism 114 has a circular cutting blade 120 disposed in a housing 122. Housing 122 is slideably received on rail 116.

Blade 120 is disposed in housing 122 opposite blade 118 as illustrated in FIG. 7. Blade 120 has a cutting edge 124 formed at its outer periphery, while blade 118 has a corresponding cutting edge 126. Rotary cutting mechanism 114 is also movably received on rail 116 such that cutting edges 124, 126 can be moved into contact with one another. Accordingly, trimmer 110 has a pair of complementary cutting blades 118, 120.

During use of trimmer 110, a piece of paper 128 is positioned between cutting edges 124, 126. Rotary cutting mechanism 114 is moved such that cutting edge 124 is contact with cutting edge 126. Then, rotary cutting mechanism 114 is slid along rail 116 such that the interaction of cutting edge 124 on cutting edge 126 severs paper 128 disposed therebetween.

Blades 118, 120 are preferably made of steel, more preferably stainless steel, such as 420 stainless steel. In addition, blades 118, 120 can be heat-treated to further increase the hardness of the complementary cutting blades.

Trimmer 110 has a coating 132 disposed on blades 118, 120. As described in detail above with respect to the exemplary embodiments of FIGS. 1 to 5, coating 132 has a thickness in a range between about 0.3 microns, more preferable about 0.1 microns.

Coating 132 provides the complementary cutting blades 118, 120 with extremely tough, hard, wear resistant characteristics. This increased hardness provides trimmer 110 with substantially increased longevity, while also providing the trimmer with corrosion resistance, as well as providing a smooth and uniform appearance and color. Coating 132 provides trimmer 110 with an aesthetically acceptable color or appearance and reduces friction between the cutting blades during use.

Coating 132 can be made of titanium nitride (TiN), chromium nitride (CrN), or titanium chromium nitride (TiCrN). More preferably, coating 32 is a multiple component barrier of titanium chromium nitride.

Coating 132 having the desired hardness, smoothness, and diffusion barrier properties preferably is formed of titanium chromium nitride having about 35 percent by weight of titanium nitride and about 65 percent by weight of chromium nitride and with a hardness in a range of about 5.7 to about 9.1 gigapascals. More preferably, coating 32 has about 50 percent by weight of titanium nitride and about 50 percent by weight of chromium nitride and a hardness in a range of about 7.2 to about 7.6 gigapascals. Thus, coating 132 provides trimmer 110 with a visual indication that the coating had been applied, without affecting the consumer's impression of the target use of the scissors (i.e., general household use). Moreover, coating 132 provides trimmer 110 with drastically improved hardness over uncoated trimmers.

Figure 8:
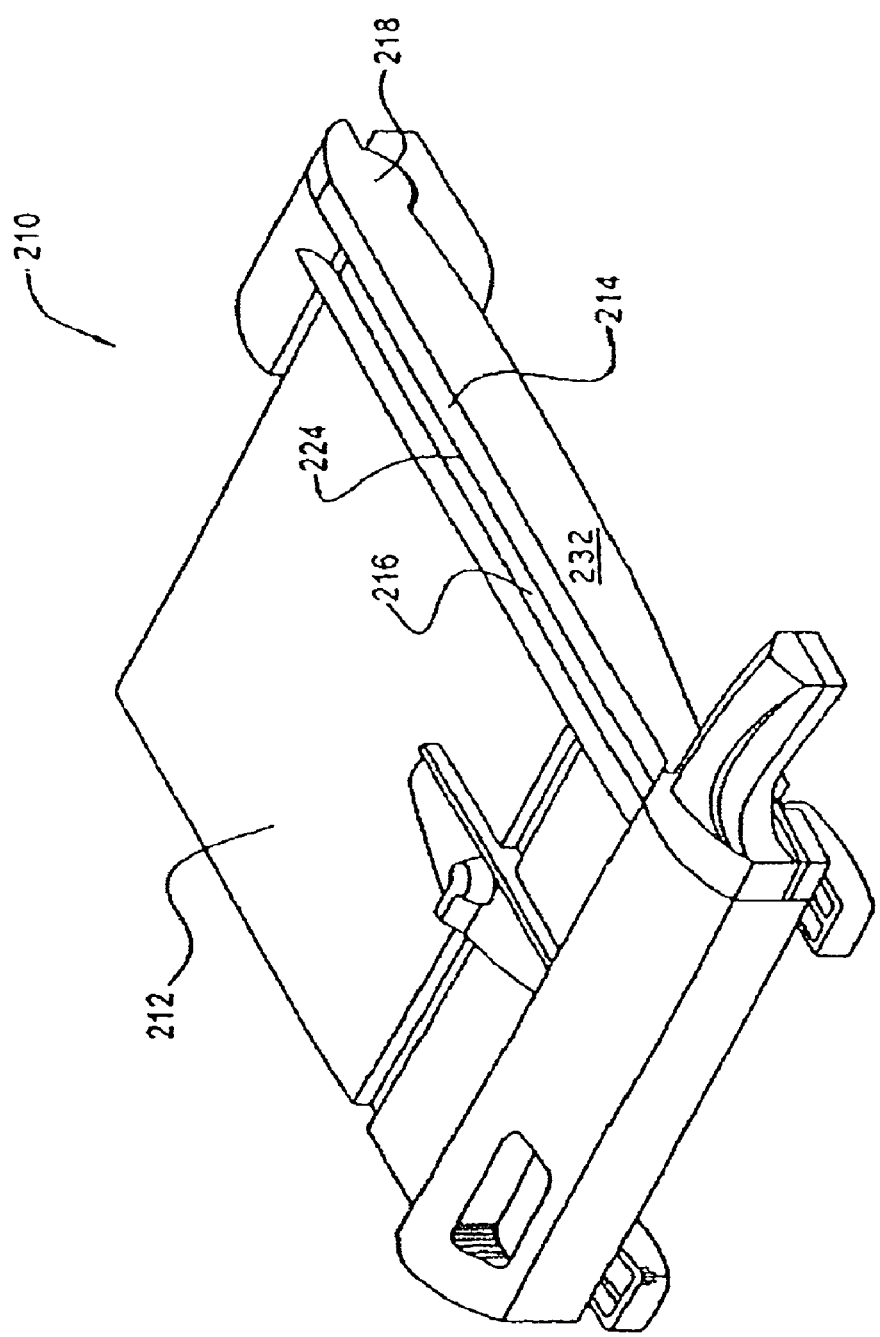
FIG. 8 is a perspective view of an exemplary embodiment of a guillotine style paper trimmer.
Figure 9:
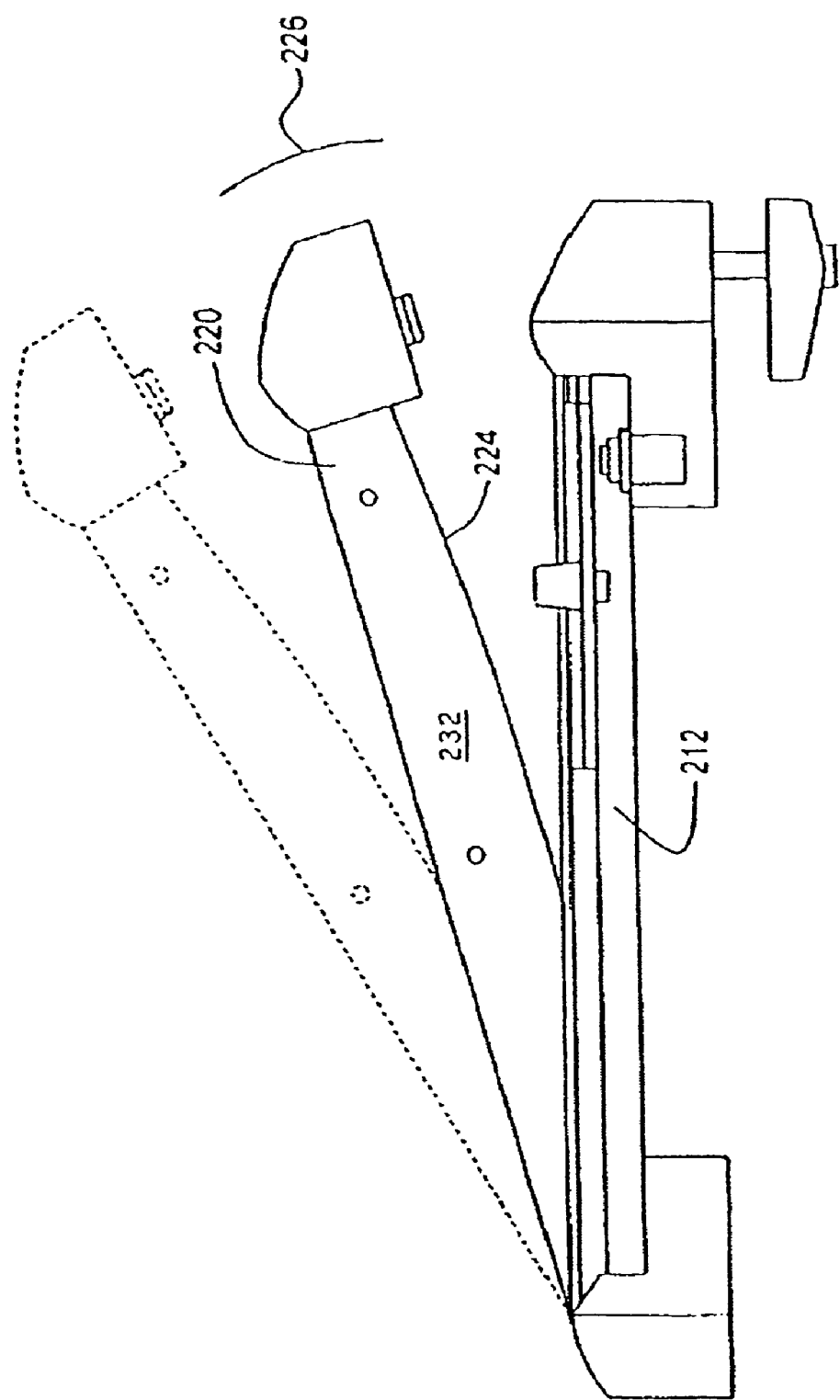
FIG. 9 is a side view of the guillotine style paper trimmer of FIG. 8.

An exemplary embodiment of a stationary cutting implement in the form of a guillotine style paper trimmer 210 is illustrated in FIGS. 8 and 9. Trimmer 210 is as shown and described in U.S. Provisional Application Ser. No. 60/392,942 filed on Jul. 1, 2002, the contents of which are incorporated herein by reference.

Trimmer 210 has a base 212 and a pivoting cutting mechanism 214. Base 212 has a fixed cutting blade 216. Pivoting cutting mechanism 214 has a movable cutting blade 220 pivotally secured to base 212 at a pivot point 218. Each blade 216, 220 has a cutting edge 224. Accordingly, trimmer 210 has a pair of complementary cutting blades 216, 220.

During use of trimmer 210, a piece of paper (not shown) is positioned on base 212 so that the portion to be cut is disposed between the cutting edges 224. Pivoting cutting mechanism 214 is moved about pivot point 218 in the direction of arrow 226 such that the cutting edges 224 shear the paper.

Cutting blades 216, 220 are preferably made of steel, more preferably stainless steel, such as 420 stainless steel. In addition, cutting blades 216, 220 can be heat-treated to further increase the hardness of the complementary cutting blades.

Trimmer 210 has a coating 232 disposed on cutting blades 216, 220. Again, coating 232 has a thickness in a range between about 0.3 microns and 0.5 microns, more preferably about 0.4 microns.

Coating 232, like coating 132, provides the complementary cutting blades with extremely tough, hard, wear resistant characteristics. This increased hardness provides trimmer 210 with substantially increased longevity, while also providing the trimmer with corrosion resistance, as well as providing a smooth and uniform appearance and color. Coating 232 provides trimmer 210 with an aesthetically acceptable color or appearance and reduces friction between the cutting blades during use.

Coating 232, like coating 132, can be made of titanium nitride (TiN), chromium nitride (CrN), or titanium chromium nitride (TiCrN). More preferably, coating 232 is a multiple component barrier of titanium chromium nitride. Coating 232 is formed of titanium chromium nitride having about 35 percent by weight of titanium nitride and about 65 percent by weight of chromium nitride and with a hardness in a range of about 5.7 to about 9.1 gigapascals. More preferably, coating 232 has about 50 percent by weight of titanium nitride and about 50 percent by weight of chromium nitride and a hardness in a range of about 7.2 to about 7.6 gigapascals.

The coating described herein for stationary cutting implements provides a cost competitive manner to improve the hardness, longevity, stain resistance, and ease of use of the cutting implement. For example, it has been found that the coating of the present invention, when applied using the aforementioned CAP process, increases the cost of the cutting implement by about seventeen cents, or less than 30% of the cost of manufacture the implement [sic].

It should also be noted that the terms "first", "second", and "third" and the like may be used herein to modify various elements. These modifiers do not imply a spatial, sequential, or hierarchical order to the modified elements unless specifically stated.

While the invention has been described with reference to one or more exemplary embodiments, it will be understood by those skilled in the art that various changes may be made and equivalents may be substituted for elements thereof without departing from the scope of the invention. In additions, many modifications may be made to adapt a particular situation or material to the teachings of the disclosure without departing from the essential scope thereof. Therefore, it is intended that the invention not be limited to the particular embodiment(s) disclosed as the best mode contemplated for carrying out this invention, but that the invention will include all embodiments falling within the scope of the appended claims.

What is claimed is:

1. A cutting implement made by a method comprising:
providing a cutting blade; and
providing a coating disposed on the cutting blade, wherein the coating is applied to the blade by physical vapor deposition using a gas consisting essentially of nitrogen and argon wherein the coating includes titanium nitride, chromium nitride and titanium chromium nitride with a titanium to chromium weight ratio in the range of 1:3 to 3:2, and further wherein the titanium nitride, chromium nitride and titanium chromium nitride are not isolated in different regions of the coating.

2. The cutting implement made by a method according to claim 1, wherein the coating is applied to the blade by a process selected from the group consisting of chemical vapor deposition, physical vapor deposition, reactive magnetron sputtering, and cathode arc plasma.

3. The cutting implement made by a method of claim 1, wherein the coating contains titanium and chromium in a weight ratio in the range of 1:3 to 1:1.

4. The cutting implement made by a method according to claim 3, wherein the cutting implement is selected from the group consisting of a pair of scissors, a rotary style paper trimmer, and a guillotine paper trimmer.

5. The cutting implement made by a method according to claim 1, wherein the coating has a thickness of 0.1-0.5 microns.

6. The cutting implement made by a method according to claim 1, wherein the coating contains titanium and chromium in a weight ratio in the range of 1:3 to 12.

7. The cutting implement made by a method according to claim 1, wherein the coating contains titanium and chromium in a weight ratio in the range of 1:2 to 1:1.

8. The cutting implement made by a method according to claim 1, wherein the cutting implement is selected from the group consisting of a pair of scissors, a rotary style paper trimmer, and a guillotine paper trimmer.

* * * * *

UNITED STATES PATENT AND TRADEMARK OFFICE
CERTIFICATE OF CORRECTION

| | | |
|---|---|---|
| PATENT NO. | : 8,245,407 B2 | Page 1 of 1 |
| APPLICATION NO. | : 11/337976 | |
| DATED | : August 21, 2012 | |
| INVENTOR(S) | : Larry Buchtmann et al. | |

It is certified that error appears in the above-identified patent and that said Letters Patent is hereby corrected as shown below:

Claim 6, column 8, line 30, delete "12" and insert --1:2--.

Signed and Sealed this
Twenty-second Day of January, 2013

David J. Kappos
*Director of the United States Patent and Trademark Office*